United States Patent
Freund

(10) Patent No.: US 9,324,965 B2
(45) Date of Patent: Apr. 26, 2016

(54) METHOD AND SYSTEM FOR AN ORGANIC LIGHT EMITTING DIODE STRUCTURE

(71) Applicant: LSI CORPORATION, San Jose, CA (US)

(72) Inventor: Joseph M. Freund, Allentown, PA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/258,360

(22) Filed: Apr. 22, 2014

(65) Prior Publication Data

US 2015/0303396 A1    Oct. 22, 2015

(51) Int. Cl.
*H01L 51/50* (2006.01)
*H01L 51/00* (2006.01)

(52) U.S. Cl.
CPC ........ *H01L 51/5096* (2013.01); *H01L 51/0017* (2013.01); *H01L 51/5012* (2013.01)

(58) Field of Classification Search
CPC ............ H01L 51/5096; H01L 51/0017; H01L 51/5012
See application file for complete search history.

(56) References Cited

U.S. PATENT DOCUMENTS

| | | | |
|---|---|---|---|
| 6,476,550 B1 * | 11/2002 | Oda et al. | 313/504 |
| 6,670,772 B1 * | 12/2003 | Arnold et al. | 315/169.3 |
| 8,319,419 B2 * | 11/2012 | Kodama et al. | 313/503 |
| 8,389,303 B2 * | 3/2013 | Takezoe et al. | 438/22 |
| 9,024,525 B2 * | 5/2015 | Furuie | 313/512 |
| 2001/0038102 A1 * | 11/2001 | Kawase | 257/98 |
| 2003/0057417 A1 * | 3/2003 | Lee et al. | 257/40 |
| 2004/0209115 A1 * | 10/2004 | Thompson et al. | 428/690 |
| 2011/0168976 A1 * | 7/2011 | Mao | 257/13 |

OTHER PUBLICATIONS

Zhi-Xiang, Gao, et al., Improved light extraction of organic light emitting diodes with a nanopillar pattering structure,, Chinese Physical Society and IOP Publishing Ltd., vol. 22, No. 11, 2013.
Hsu, Ching-Mei, Wafer-scale silicon nanopillars and nanocones by Langmuir-Blodgett assembly and etching, Applied Physics Letter 93, American Institute of Physics, 2008, downloaded Oct. 26, 2008.

* cited by examiner

*Primary Examiner* — Anne Hines

(57) ABSTRACT

Disclosed is a system and method for a nano-pillar geometry for increased light extraction properties of an Organic Light Emitting Diode.

19 Claims, 5 Drawing Sheets

Area for recombination (horizontal surfaces) is increased.

Area for recombination (horizontal surfaces) is increased.

METHOD AND SYSTEM FOR AN ORGANIC LIGHT EMITTING DIODE STRUCTURE

FIELD OF THE INVENTION

The field of the invention relates generally to OLEDs (Organic Light Emitting Diodes).

BACKGROUND OF THE INVENTION

A liquid-crystal display (LCD) is a flat panel display, electronic visual display, or video display that uses the light modulating properties of liquid crystals. Liquid crystals do not emit light directly. LCDs are available to display arbitrary images (as in a general-purpose computer display) or fixed images which can be displayed or hidden, such as preset words, digits, and 7-segment displays as in a digital clock. They use the same basic technology, except that arbitrary images are made up of a large number of small pixels, while other displays have larger elements. LCDs are used in a wide range of applications including computer monitors, televisions, instrument panels, aircraft cockpit displays, and signage. They are common in consumer devices such as video players, gaming devices, clocks, watches, calculators, and telephones, and have replaced cathode ray tube (CRT) displays in most applications. They are available in a wider range of screen sizes than CRT and plasma displays, and since they do not use phosphors, they do not suffer image burn-in. LCDs are, however, susceptible to image persistence. An LCD is a display choice in small devices. LCD displays also are generally popular for large screen televisions.

A light-emitting diode (LED) is a two-lead semiconductor light source that resembles a basic pn-junction diode, except that an LED also emits light. When an LED's anode lead has a voltage that is more positive than its cathode lead by at least the LED's forward voltage drop, current flows. Electrons are able to recombine with holes within the device, releasing energy in the form of photons. This effect is called electroluminescence, and the color of the light (corresponding to the energy of the photon) is determined by the energy band gap of the semiconductor. An LED is often small in area (less than 1 mm2), and integrated optical components may be used to shape its radiation pattern. Regular LEDs often form the digits on digital clocks and other electronic devices.

OLEDs offer many advantages over both LCDs and regular LEDs. An OLED (organic light-emitting diode) is an LED in which the emissive electroluminescent layer is a film of organic compound which emits light in response to an electric current. This layer of organic semiconductor is situated between two electrodes. Generally, at least one of these electrodes is transparent. OLEDs are generally used to create digital displays in devices such as television screens, computer monitors, portable systems such as mobile phones, handheld games consoles and PDAs. The plastic, organic layers of an OLED are thinner, lighter and more flexible than the crystalline layers in an LED or LCD. Because the light-emitting layers of an OLED are lighter, the substrate of an OLED can be flexible instead of rigid. OLED substrates can be plastic rather than the glass used for LEDs and LCDs. OLEDs are brighter than LEDs. Because the organic layers of an OLED are much thinner than the corresponding inorganic crystal layers of an LED, the conductive and emissive layers of an OLED can be multi-layered. Also, LEDs and LCDs require glass for support, and glass absorbs some light. OLEDs do not require glass. OLEDs do not require backlighting like LCDs. LCDs work by selectively blocking areas of the backlight to make the images that you see, while OLEDs generate light themselves. Because OLEDs do not require backlighting, they consume much less power than LCDs (most of the LCD power goes to the backlighting). This is especially important for battery-operated devices such as cell phones. OLEDs are easier to produce and can be made to larger sizes. Because OLEDs are essentially plastics, they can be made into large, thin sheets. It is much more difficult to grow and lay down so many liquid crystals. OLEDs have large fields of view, about 170 degrees. Because LCDs work by blocking light, they have an inherent viewing obstacle from certain angles. OLEDs produce their own light, so they have a much wider viewing range. One technique that has been employed to improve the performance of OLEDs is the incorporation of nano-pillar geometry patterning within the OLEDs structure. The technique is described for example in the paper entitled, "Improved light extraction of organic light emitting diodes with a nano-pillar pattering structure", Chin. Phys. B Vol. 22, No. 11 (2013) 116801.

SUMMARY OF THE INVENTION

An embodiment of the invention may therefore comprise an organic light emitting diode structure, the structure comprising a first layer, and a second layer, wherein the first layer and the second layer are adjacent to each other and the second layer comprises a plurality of spaced inverted non-cylindrical nano-pillars.

An embodiment of the invention may further comprise a method of fabricating a structure for an organic light emitting diode comprising a first layer and a second layer situated adjacent to each other, the method comprising etching the second layer to produce a plurality of spaced inverted non-cylindrical nano-pillars.

An embodiment of the invention may further comprise an apparatus comprising an organic light emitting diode structure, the organic light emitting diode structure comprising a first layer, and a second layer, wherein the first layer and the second layer are adjacent to each other and the first or second layer comprises a plurality of spaced inverted non-cylindrical nano-pillars.

DETAILED DESCRIPTION OF THE EMBODIMENTS

An OLED (organic light-emitting diode) is an LED in which the emissive electroluminescent layer is a film of organic compound which emits light in response to an electric current. This layer of organic semiconductor is situated between two electrodes. Generally, at least one of these electrodes is transparent. OLEDs are generally used to create digital displays in devices such as television screens, computer monitors, portable systems such as mobile phones, handheld games consoles and PDAs. There are two main families of OLED: those based on small molecules and those employing polymers. Adding mobile ions to an OLED creates a light-emitting electrochemical cell (LEC), which has a slightly different mode of operation. OLED displays can use either passive-matrix (PMOLED) or active-matrix addressing schemes. Active-matrix OLEDs (AMOLED) require a thin-film transistor backplane to switch each individual pixel on or off, but allow for higher resolution and larger display sizes. An OLED display works without a backlight. Thus, it can display deep black levels and can be thinner and lighter than a liquid crystal display (LCD). In low ambient light conditions such as a dark room an OLED screen can achieve a higher contrast ratio than an LCD, whether the LCD uses cold cathode fluorescent lamps or LED backlight.

Generally, an OLED is a solid-state semiconductor device that is 100 to 500 nanometers thick or about 200 times smaller than a human hair. However, it is understood that the size and measurements of an OLED may vary. An OLED may have two or more layers of organic material. In a multi-layer design of an OLED, for instance three layers, the third layer may help transport electrons from the cathode to the emissive layer.

In general, the plastic, organic layers of an OLED are thin, light and flexible in comparison to the crystalline layers in a LCD or a regular LED. Since the light-emitting layers of an OLED are light, the substrate of an OLED can be flexible instead of rigid. Accordingly, OLED substrates can be plastic rather than glass, or an other more rigid substance. Since the organic layers on an OLED are thin, for instance in comparison to the crystal layers of an LED, OLEDs are generally brighter. This is because the OLEDs' emissive and conductive layers can be multi-layered. As noted, OLEDs do not require glass for support. The possible absorption of light due to the presence of the glass is avoided.

LCDs generally operate by selectively blocking areas of the backlight to make a visible image. OLEDs generally generate light and accordingly do not require backlighting. As such, through the generation of their own light, OLEDs provide an efficiency in power consumption. In a battery-operated device, such as a cell phone, the elimination of the need for extraneous backlighting may increase battery life.

Figure 1:
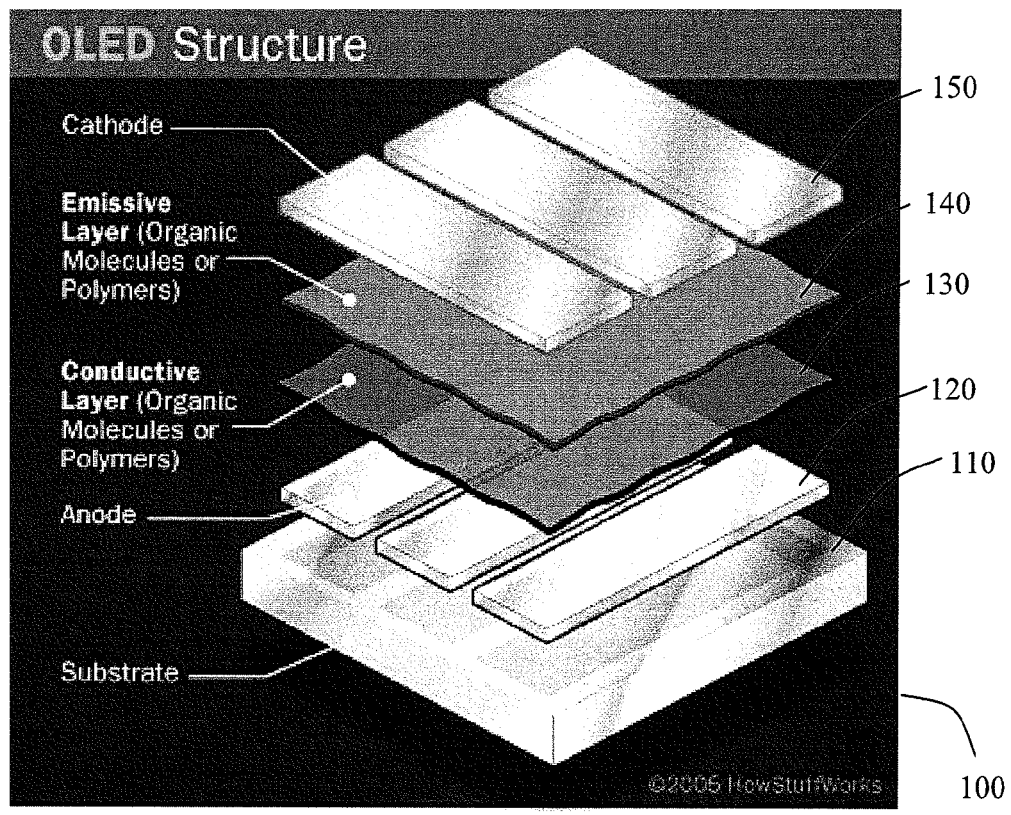
FIG. 1 shows an Organic Light Emitting Diode structure.

FIG. 1 shows an Organic Light Emitting Diode structure. The OLED structure 100 shows a substrate 110, an anode 120, a conductive layer 130, an emissive layer 140 and a cathode 150. The structure 100, as shown in FIG. 1, comprises two organic layers, the emissive layer 140 and the conductive layer 130. As discussed herein, those skilled in the art will understand the use of multiple layers, such as three or more, in the structure of an OLED. Multiple layers beyond two layers are not shown in FIG. 1 but are understood.

As shown in FIG. 1, an OLED structure 100 generally consists of a number of different layers. A substrate layer 110 may provide support to the OLED. The substrate layer 110 may be composed of a clear plastic, glass or foil. Those skilled in the art will understand that other suitable compositions or materials may be suitable for use as an OLED substrate layer. Further, the choice of a substrate layer 110 may be influenced by the intended use of the OLED and whether flexibility, battery efficiency, light quality or other quality is a consideration.

An anode layer 120 generally is used in an OLED as an electron removal layer. The removal of electrons is equivalent with the addition of electron holes. The removal of electrons occurs when a current flows through a device. The anode 120 is an electrode through with electric charge flows into a polarized electrical device. The flow of charge is an electric current. Positive charge flowing into an anode is the same as (negative) electrons flowing out of the anode. In a diode, the anode 120 is generally the positive terminal where current flows into the device. Typically, electrode naming for diodes is always based on the direction of the forward current.

One or more of the organic layers (130, 140) may be comprised of organic molecules or polymers. Molecules used in OLEDs include organometallic chelates (Alq3, for example) fluorescent and phosphorescent dyes and conjugated dendrimers. Those skilled in the art will recognize a wide variety of materials suitable for an organic layer in an OLED. These may include, but are not necessarily limited to, the mentioned molecules and others, polymers such as poly (p-phenylene binylene) and polyflourene, and phosphorescent materials using an elecrophosphorescence enabled material to convert electrical energy in an OLED into light. Other molecules and organic layers are known, or may become known, that those skilled in the art will understand as useful in embodiments of the invention.

One organic layer is a conducting layer 130 may be made of organic plastic molecules that transport "holes" from the anode. One such conducting polymer used in OLEDs is polyaniline. Those skilled in the art will understand other suitable conducting layers 130 useful in embodiments of the invention.

One organic layer is an emissive layer 140 may be made of organic plastic molecules. These may be different organic materials from that of the conducting layer. The emissive layer 140 transports electrons from the cathode. Essentially, this is the layer that produces visible light. One polymer that may be used in the emissive layer 140 is polyflourene. Those skilled in the art will understand other suitable emissive layer 140 materials.

A cathode layer 150 injects electrons when a current flows through the device. The cathode layer 150 may or may not be transparent depending on the type of OLED being used or constructed. Those skilled in the art will understand a variety of cathode materials suitable for use in different settings.

During construction of an OLED, the organic layers, the emissive layer and the conductive layer, must be applied to the structure. The application of the organic layers may be performed in a variety of ways. Vacuum deposition may be used to apply the organic layers to the structure 100. Vacuum deposition may also be referred to as vacuum thermal evaporation (VTE). In a vacuum chamber, the organic molecules are heated to the point of evaporation. The organic molecules are allowed to condense as a thin film onto cooled substrates. Those skilled in the art will understand a variety of vacuum deposition processes. Vacuum deposition, or VTE, is generally considered a family of processes used to deposit layers of material atom-by-atom or molecule-by-molecule on a solid surface. These processes generally operate at pressures well below atmospheric pressure (i.e. vacuum). The deposited layers can range from a thickness of one atom up to millimeters, forming freestanding structures. Multiple layers of different materials can be used, for example to form optical coatings. When the vapor source is a liquid or solid the process may be referred to as physical vapor deposition (PVD). When the source is a chemical vapor precursor the process may be referred to as chemical vapor deposition (CVD). The latter has several variants: low-pressure chemical vapor deposition (LPCVD), plasma-enhanced CVD (PECVD), and plasma-assisted CVD (PACVD). Often a combination of PVD and CVD processes are used in the same or connected processing chambers. The vacuum environment may serve one or more purposes: reducing the particle density so that the mean free path for collision is long; reducing the particle density of undesirable atoms and molecules (contaminants); providing a low pressure plasma environment; providing a means for controlling gas and vapor composition; and providing a means for mass flow control into the processing chamber.

Condensing particles can be generated in various ways: thermal evaporation, Evaporation (deposition); sputtering; cathodic arc vaporization; laser ablation; and decomposition of a chemical vapor precursor, chemical vapor deposition The organic layers 100 may also be deposited on the substrate with Organic Vapor Phase Deposition (OVPD). In OVPD, a low-pressure, hot-walled reactor chamber is used for transport of evaporated organic molecules by a carrier gas. The transported evaporated organic molecules are transported onto cooled substrates where they condense into thin films. In essence OVPD transports organic molecules to a cold substrate by a hot inert carrier gas. OVPD is useful for the deposition of organic semiconductors and is capable of patterned growth with micron resolution. Also, direct printing of molecular organic materials may be performed with organic vapor jet printing where molecules are carried to the substrate by a hot carrier gas jet. The diameter of the deposit may be limited by the gas jet dynamics and nozzle dimensions and is capable of generating patterns. Similar to inkjet printing, the deposition of individual pixels on extended plastic substrates continuously deployed in close proximity to the localized jet of gas is achieved. Organic Vapor Jet Printing differs from solution-based inkjet printing of polymers in that the solvent in OVJP is a gas. Those skilled in the art will understand the applicability of OVPD to embodiments of the invention.

The organic layers 100 may also be applied to the substrate with inkjet printing. With inkjet printing of OLEDs, OLEDs are sprayed onto substrates just like inks are sprayed onto paper during printing. Inkjet technology, like that of OVPD and OVJP, provide efficient OLED production.

Figure 2:
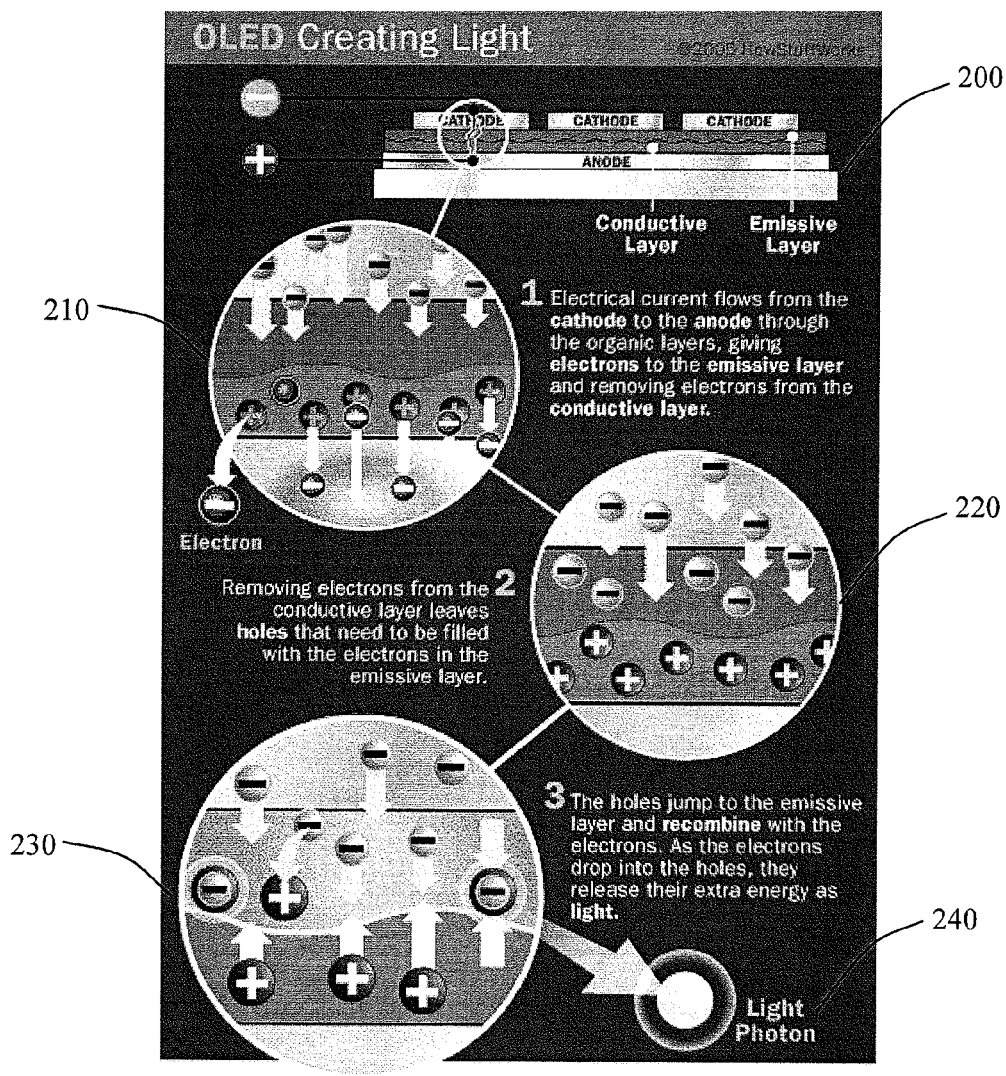
FIG. 2 shows an OLED creating light.

FIG. 2 shows an OLED creating light. In an OLED structure 200, a voltage is applied. An electrical current flows 210 from the cathode to the anode through the organic layers. This process of current flow 210 gives electrons to the emissive layer and removes electrons from the conductive layer. Electrons are removed from the conductive layer 220. This leaves holes in the conductive layer that need to be filled with electrons from the emissive layer. The holes will jump to the emissive layer in a next process 230. The holes will recombine with the electrons. As the electrons drop into the holes, they release their extra energy as light.

As discussed above and in connections with FIG. 2, an OLED is enabled to emit light in a manner similar to a conventional LED. The process, from application of a voltage to release of energy as light, is commonly referred to as electrophosphorescence. In the process of electrophosphorescence a battery, or other power supply of the OLED device, applies a voltage across the OLED. The applied voltage causes an electrical current to flow from the cathode 150 to the anode 120 through the organic layers 130, 140. As is understood by those skilled in the art, an electrical current is a flow of electrons. The cathode 150 essentially gives electrons to the emissive layer 140 of organic molecules. The anode 120 essentially removes electrons from the conductive layer 130 of organic molecules. This is equivalent to giving electron holes to the conductive layer 130 from the anode 120. As is understood, an electron hole is the conceptual and mathematical opposite of an electron. The concept of an electron hole describes the lack of an electron at a position where one could exist in an atom or atomic lattice. At the boundary between the emissive 140 and the conductive 130 layers, electrons will find electron holes. When an electron finds an electron hole, the electron fills the hole. In essence, the electron will fall into an energy level of the atom that is missing an electron—the hole. The electron will give up energy in the form of a photon of light. This is generally referred to as recombination. Those skilled in the art will understand the applicability of electrophosphorescence and recombination to embodiments of the invention.

Figure 3:
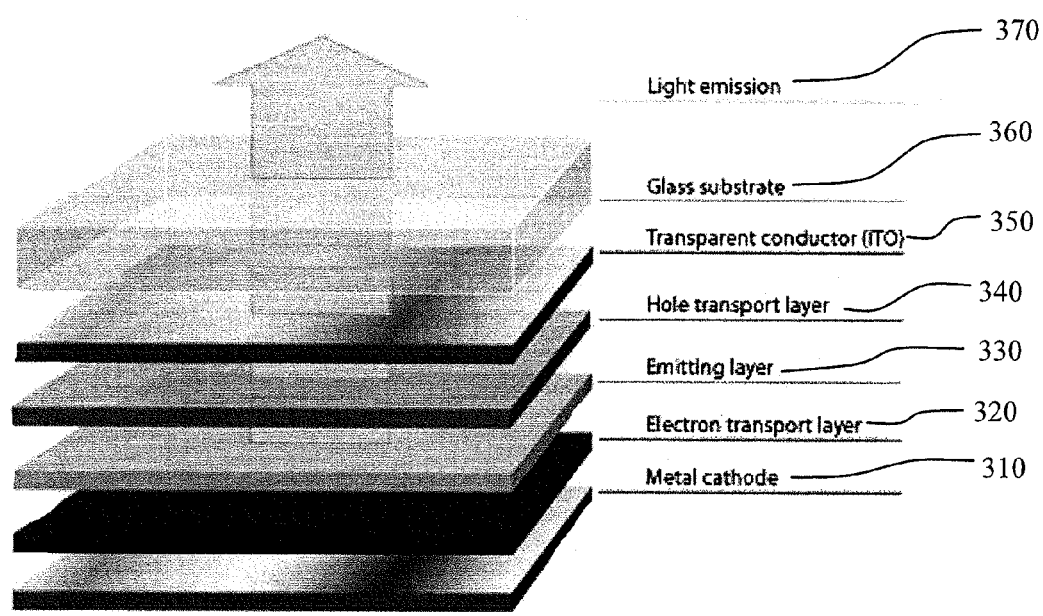
FIG. 3 shows an OLED structure with electron and hole transport layers.

FIG. 3 shows an OLED structure with electron and hole transport layers. The OLED structure 300 comprises a metal cathode 310, an electron transport layer 320, an emitting layer 330, a hole transport layer 340, a transparent conductor (ITO) 350 and a glass substrate 360. A light emission 370 is also shown to indicate the direction of light emission. However, it is understood that light emission is not physically a part of the structure 300.

As shown, the structure 300 has separate hole transporting 340 and electron transporting 320 layers. These layers operate such that the recombination and light emission occur in the middle of the organic layer. Generally, this results in a reduction in operating voltage and improvements in efficiency. The transporting layers 320, 340 are understood by those skilled in the art and the applicability to embodiments of the invention is understood by those skilled in the art.

Other OLED structures are possible as understood by those skilled in the art. The recombination probability and the resulting maximum light intensity of an OLED may largely depend on the controlled injection of charge carriers and their confinement. In single layer OLEDs, recombination of carriers is highly affected due to quenching effects at the cathode. In multilayer OLEDs, effective use of blocking and emissive layers provides better recombination of charge carriers leading to improved electroluminescence, and high efficiency. Those skilled in the art will understand the effectiveness of hole and electron blocking and injections layers. Further, those skilled in the art will understand balancing of mobilities of charge carriers is necessary to optimize electro-luminescence efficiency. The thickness of hole injection layers may affect the mobility of holes and also increase the concentration of holes in the emissive layer. A hole blocking layer may prevent the leakage of holes toward the cathode and also provide a preferential path for the travel of electrons from the cathode toward the emissive layer. A hole blocking material between the emitting layer and the electron transfer layer may allow more recombination in the emitting layer. When a blocking layer is formed, the hole is trapped in the emission zone. This increases the probability of recombination and, the luminous efficiency.

Further, the introduction of nano-pillars to pattern the interface broadens the carrier recombination space. This is due to a majority of the carrier recombination occurring at the area adjacent to the electron blocking layer and emitting layer interface. This may avoid carrier accumulation.

Figure 4:
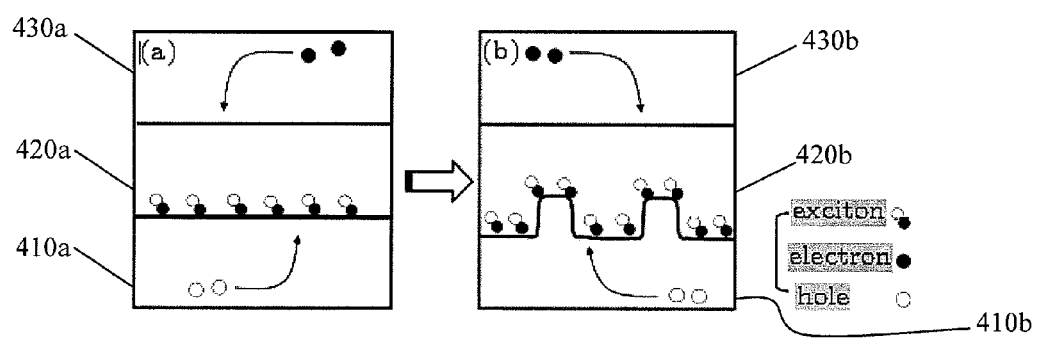
FIG. 4 shows a nano-pillar pattern comparison at an interface.

FIG. 4 shows a nano-pillar pattern comparison at an interface. A hole blocking layer 430a, emissive layer 420a and a hole transport layer 410a are shown in a structure that is without any pillaring. A hole blocking layer 430b, emissive layer 420b and a hole transport layer 410b are shown in a structure that has nano-pillars at an interface between the emitting layer and the hole transport layer 410b and the emissive layer 420b. The nano-pillars increases the surface area adjacent to the interface. This increased surface area broadens the carrier recombination space which in turn reduces carrier accumulation.

Those skilled in the art of electronics fabrication will understand the concept of transferring and enlarging the pattern from one nano-structured layer to another underlying layer. Using traditional microelectronics fabrication, selective etching removes the material in an underlying layer where the masking layer above does not cover. Many selective etchants are liquid chemical solutions, and hence, isotropic. When a material beneath a masking layer is etched using a isotropic etching method, a naturally occurring phenomenon known as undercutting can occur. Undercutting is characterized by an enlargement of the pattern transferred, corresponding to when the targeted material is over-etched. The shape and extent of pattern enlargement is largely dependent on the thickness of the underlying layer and the dimensions of the masking pattern openings. Undercutting is generally an undesirable feature for semiconductor fabrication. Several techniques have been developed to limit or eliminate the effects of undercutting during the fabrication of nano-structures.

A variety of methodologies have emerged to produce high-extraction-efficiency in non-undercut structures. Methods for nano-structure pillar fabrication that are used in OLEDs may include AAO templating, nano-imprinting lithography, e-beam lithography and nano-sphere lithography. Resulting types of resultant nano-structures may include conical (pillar), spherical, pointed, upright pyramidal, rectangular, and other types where the sides are either substantially perpendicular or incline inward on each structure to produce a structure that is thicker on the bottom than on the top.

Figure 5:
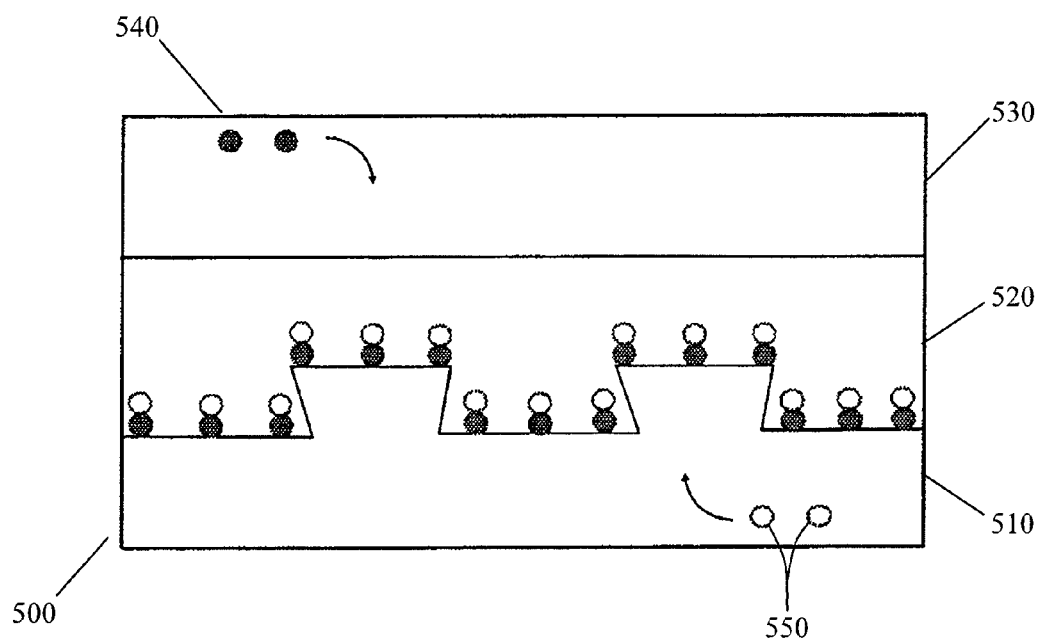
FIG. 5 shows a broadened carrier recombination space in an OLED device.

In an embodiment of the invention, the carrier recombination space is increased further and a carrier accumulation is further reduced with an improved geometry. FIG. 5 shows a broadened carrier recombination space in an OLED device. The structure 500 shows a hole transport layer 510, an emissive layer 520 and a hole blocking layer. As shown in FIG. 5, the pillars are pyramidal. The pyramidal structure of the pillars increases the area available for recombination. The more acute the angle of the undercut, or pyramidal structure, the more area is available for recombination. As the area for recombination increases the amount of carrier accumulation is reduced. Also as shown, the pyramidal structures are inverted in relation to the hole blocking layer. This, in essence means, that the larger portion of the pyramidal structure is distal from the body of the layer rather than sitting on top of the layer with the smaller portion of the structure away from the body of the layer. It is understood that other inverted, shaped structures are possible. An inverted conical structure may be formed which also allows for an increased recombination space. Any inverted shape which allows for the increased recombination space is understood.

Embodiments of the invention may be utilized in digital television systems, mobile phone systems, PDA (Personal Digital Assistant) systems, and a car infotainment system (a system that provides entertainment usages and information usages). Those skilled in the art will understand utilization in systems that provide visual information and entertainment to a user.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An organic light emitting diode structure, said structure comprising:
    a first layer; and
    a second layer;
    wherein said first layer and said second layer are adjacent to each other and said second layer comprises a plurality of spaced inverted non-cylindrical nano-pillars.

2. The structure of claim 1, wherein said plurality of non-cylindrical nano-pillars comprises a plurality of inverted pyramidal nano-pillars.

3. The structure of claim 1, wherein said plurality of non-cylindrical nano-pillars comprises a plurality of inverted conical nano-pillars.

4. The structure of claim 1, wherein said first layer comprises an electron blocking layer.

5. The structure of claim 1, wherein said second layer comprises an emissive layer.

6. The structure of claim 1, wherein said first layer comprises a conductive layer and said second layer comprises an emissive layer.

7. The structure of claim 1, wherein said structure further comprises:
    a hole injection layer, a hole blocking layer, an electron transport layer and an electron injection layer.

8. The structure of claim 1, wherein said plurality of spaced inverted non-cylindrical nano-pillars are generated by the isotropic etching of said second layer.

9. A method of fabricating a structure for an organic light emitting diode comprising a first layer and a second layer situated adjacent to each other, said method comprising:
    etching said second layer to produce a plurality of spaced inverted non-cylindrical nano-pillars.

10. The method of claim 9, wherein said plurality of non-cylindrical nano-pillars comprises a plurality of inverted pyramidal nano-pillars.

11. The method of claim 9, wherein said plurality of non-cylindrical nano-pillars comprises a plurality of inverted conical nano-pillars.

12. The method of claim 9, wherein said first layer comprises an electron blocking layer.

13. The method of claim 9, wherein said second layer comprises an emissive layer.

14. The method of claim 9, wherein said first layer comprises a conductive layer and said second layer comprises an emissive layer.

15. The method of claim 14, wherein said plurality of non-cylindrical nano-pillars comprises a plurality of inverted pyramidal nano-pillars.

16. An apparatus comprising an organic light emitting diode structure, said organic light emitting diode structure comprising:
    a first layer; and
    a second layer;
    wherein said first layer and said second layer are adjacent to each other and said first or second layer comprises a plurality of spaced inverted noncylindrical nano-pillars.

17. The apparatus of claim 16, wherein said apparatus is a display device.

18. The apparatus of claim 16, wherein said apparatus is one of a digital television, mobile phone, PDA, and a car infotainment system.

19. The apparatus of claim 16, wherein said plurality of non-cylindrical nano-pillars comprises one of a plurality of inverted pyramidal nano-pillars and a plurality of inverted conical nano-pillars.

* * * * *